United States Patent
Adamec

(12) 
(10) Patent No.: US 6,747,279 B2
(45) Date of Patent: Jun. 8, 2004

(54) OBJECTIVE LENS FOR A CHARGED PARTICLE BEAM DEVICE

(75) Inventor: Pavel Adamec, Heimstetten (DE)

(73) Assignee: ICT Integrated Circuit Testing Gesellschaft für Halbleiterprüftechnik mbH, Heimstetten (DE)

(*) Notice: Subject to any disclaimer, the term of this patent is extended or adjusted under 35 U.S.C. 154(b) by 0 days.

(21) Appl. No.: 10/182,437
(22) PCT Filed: Jan. 26, 2001
(86) PCT No.: PCT/EP01/00857
§ 371 (c)(1), (2), (4) Date: Oct. 3, 2002
(87) PCT Pub. No.: WO01/56056
PCT Pub. Date: Aug. 2, 2001

(65) Prior Publication Data
US 2003/0089859 A1 May 15, 2003

(30) Foreign Application Priority Data
Jan. 27, 2000 (EP) .............................................. 00101708

(51) Int. Cl.[7] ................................................ H01J 37/10
(52) U.S. Cl. .............................. 250/396 ML; 250/310; 250/396 R; 250/398
(58) Field of Search ................... 250/396 ML, 396 R, 250/391, 398, 310, 311, 492.2

(56) References Cited

U.S. PATENT DOCUMENTS

| | | | | |
|---|---|---|---|---|
| 4,912,405 A | * | 3/1990 | Richardson | 250/396 ML |
| 6,380,546 B1 | * | 4/2002 | Petrov et al. | 250/396 R |
| 6,515,287 B2 | * | 2/2003 | Notte, IV | 250/396 ML |

FOREIGN PATENT DOCUMENTS

| | | |
|---|---|---|
| EP | 0 952 606 A | 10/1999 |
| EP | 0 969 493 A | 1/2000 |

OTHER PUBLICATIONS

Patent Abstracts of Japan, vol. 006, No. 077 (E-106) May 14,1982 (JP 57 015421 A).
Patent Abstracts of Japan, vol. 003, No. 156 (E-161) Dec. 21, 1979 (JP 54 137977 A).

* cited by examiner

Primary Examiner—Nakita Wells
Assistant Examiner—James P. Hughes
(74) Attorney, Agent, or Firm—Sughrue Mion, PLLC

(57) ABSTRACT

An improved objective lens for a charged particle beam device is constituted by, among other things, a magnetic lens that creates a first magnetic field for focussing the charged particle beam onto the specimen. Furthermore, a deflector is integrated into the magnetic lens by providing at least one additional coil arrangement that creates a second magnetic field used to deflect the charged particle beam. Thereby, the second magnetic field is guided through at least one of the pole pieces of the magnetic lens. The present invention also provides an improved column for a charged particle beam device including the improved objective lens.

26 Claims, 9 Drawing Sheets

OBJECTIVE LENS FOR A CHARGED PARTICLE BEAM DEVICE

This is a National stage entry under 35 U.S.C. § 371 of Application No. PCT/EP01/00857 filed Jan. 26, 2001; the disclosure of which is incorporated herein by reference.

FIELD OF THE INVENTION

The invention relates to an apparatus for the examination of specimen with a beam of charged particles. In particular, this invention relates to an objective lens for a charged particle beam device.

BACKGROUND OF THE INVENTION

The resolution of the conventional optical microscopy is limited by the wavelength of the visible light. Furthermore, at the highest resolution the conventional optical microscopy has a very shallow depth of field. These two limitations have led to the increased popularity of charged particle devices for the examination of specimen. Compared to optical light, accelerated charged particles, for example electrons, exhibit a shorter wavelength, which leads to an increased resolution power. Furthermore, even at the highest resolution charged particle devices usually exhibit a large depth of field. Accordingly, charged particle beams, especially electron beams, are used in a variety of ways in biology, medicine, the materials sciences, and lithography. Examples include the diagnosis of human, animal, and plant diseases, visualization of sub cellular components and structures such as DNA, determination of the structure of composite materials, thin films, and ceramics, or the inspection of masks and wafers used in semiconductor technology. In addition to that, charged particle beam devices, may also be used for the modification of organic and inorganic materials and their surfaces.

In these instruments, the area to be examined and/or modified is irradiated with a charged particle beam, which may be static or swept in a raster across the surface of the specimen. Depending on the specific application, the charged particle beam is more or less focused and the kinetic energy of the particles can vary considerably. The types of signals produced when the charged particles impinge on a specimen surface include e.g. secondary electrons, backscattered electrons, Auger electrons, characteristic x-rays, and photons of various energies. These signals are obtained from specific emission volumes within the sample and can be used to examine many characteristics of the sample such as composition, surface topography, crystallography, etc.

In charged particle beam devices, such as a scanning electron microscope (SEM), the charged particle beam exhibits a typical aperture angle as well as a typical angle of incidence in the order of several millirads. However, for many applications it is desirable that the charged particle beam hits the sample surface under a much larger angle of typically 5° to 10°, corresponding to 90 to 180 millirads. Stereoscopic visualization is an example for such an application. Some applications even require tilt angles in excess of 15° or even 20°. Thereby, a number of tilting mechanism can be used. In early solutions, an oblique angle of incidence was achieved by mechanically tilting the specimen. However, due to mechanical imperfections, a lateral movement of the specimen is inevitable, which often results in misregistrations between two pictures having two different viewing angles.

An oblique angle of incidence may also be achieved by electrically tilting the charged particle beam. This is usually done by deflecting the beam so that either by the deflection alone or in combination with the focussing of the beam an oblique angle of incidence results. Thereby, the specimen can remain horizontal, which is a significant advantage as far as the lateral coordinate registration is concerned. Electrical tilting is also much faster than its mechanical counterpart. The electrical method, however, has also certain drawbacks. Especially, in low energy electron microscopy the magnetic or compound objective lens has to be very strong with very short focal length (1–20 mm), in order to achieve high resolution. In the presence of such a lens it is difficult to influence the landing position or landing angle of the charged particle beam at the specimen surface. In general, the strength of the deflector field has to be comparable to the field of the objective lens. To achieve such strong deflection fields the deflector usually has to employ pole pieces made from magnetically soft material (e.g. mumetal or permenorm). Furthermore, it is usually necessary to concentrate the deflection field to an area close to the optical axis. However, in conventional systems the corresponding pole pieces can not be placed close to the objective lens gap because they would negatively influence the field distribution of the lens. If, however, the deflector is placed in sufficient distance after the objective lens, usually a resolution degradation due to the increased working distance will result. Furthermore, if the deflector is placed before the objective lens, usually high offaxis aberrations will result.

SUMMARY OF THE INVENTION

The present invention provides an improved objective lens for a charged particle beam device. According to one aspect of the present invention, there is provided a objective lens for a charged particle beam device as specified in independent claim 1. According to a further aspect of the present invention there is provided a column for a charged particle beam device as specified in independent claims 16 or 17. Further advantages, features, aspects and details of the invention are evident from the dependent claims, the description and the accompanying drawings. The claims are intended to be understood as a first non-limiting approach of defining the invention in general terms.

The present invention provides an improved objective lens for a charged particle beam device. The objective lens comprises a magnetic lens that creates a first magnetic field for focussing the charged particle beam onto the specimen. Furthermore, a deflector is integrated into the magnetic lens by providing at least one additional coil arrangement that creates a second magnetic field used to deflect the charged particle beam. Thereby, the second magnetic field is guided through at least one of the pole pieces of the magnetic lens. The present invention also provides an improved column for a charged particle beam device including the improved objective lens.

By integrating the deflector into the objective lens, large angles of incidence can be achieved without causing large lateral movements of the charged particle beam on the specimen. Furthermore, due to the integration of the deflector into the objective lens, the working distance of the system can be kept small, so that the resolution of the system is not negatively influenced. The objective lens can be used to produce stereo images of a specimen in a fast and reliable manner. Accordingly, the additional information which is contained in stereo images and which is extremely valuable in many cases, can be accessed without causing any additional costs.

The present invention also provides an improved column for a charged particle beam device. The column comprises a magnetic deflector having at least one excitation coil arrangement for generating a magnetic field to deflect the charged particle beam and being arranged between the objective lens and specimen whereby the objective lens concentrates the magnetic field of the deflector in a region close to the specimen Due to field termination effect of the objective lens, the magnetic deflector can be placed very close to objective lens without interfering with the focussing properties of the objective lens. Accordingly, the working distance of the system can be kept small, so that the resolution of the system is not negatively influenced

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Figure 1:
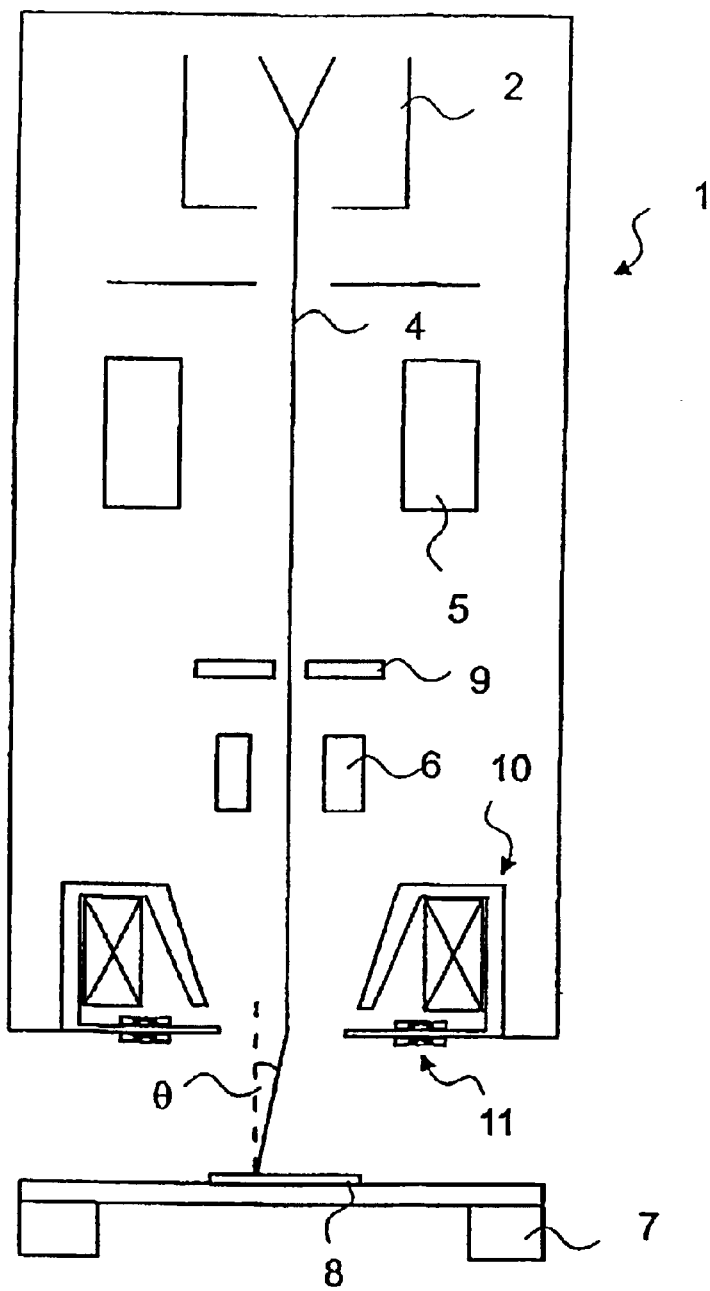
FIG. 1 shows schematically a column according to a first embodiment according to the present invention.

An embodiment according to the invention is shown schematically in FIG. 1. The column 1 for a charged particle beam device comprises a charged particle source 2 which emits a beam 4 of charged particles. In electron beam devices, electron sources such as Tungsten-Hairpin guns, Lanthanum-Hexaboride Guns, Field emission guns etc. can be used. The invention, however, is not limited to electron sources; it can be used together with all kinds of charged particle sources. The electrons are accelerated by an accelerating voltage supplied to the electron source 2. Since the beam diameter produced directly by the electron source usually is too large to generate a sharp image at high magnification, the electron beam 4 is guided through the condenser lens 5, which demagnifies the beam and leads the electron beam 4 towards a specimen 8.

The electron beam 4 then passes the detector 9 which is used to detect those particles that come from the specimen 8 in order to produce an image of the specimen 8. The detector 9 is followed by the scanning coils 6, which are used to move the electron beam 4 in a television-like raster over the surface of the specimen 8. After the scanning coils 12 the electron beam 4 enters the objective lens 10 that focuses the electron beam 4 onto the specimen 8. The objective lens 10 not only focuses the electron beam 4 but also rotates the electron beam 4. However, this effect is not shown, because it is difficult to depict in a two-dimensional drawing and because the skilled person is well aware of this additional effect.

When the particles of beam 4 strike the surface of specimen 8, they undergo a series of complex interactions with the nuclei and electrons of the atoms of the specimen. The interactions produce a variety of secondary products, such as electrons of different energy, X rays, heat, and light. Many of these secondary products are used to produce the images of the sample and to collect additional data from it. A secondary product of major importance to examination or the image formation of specimens are secondary electrons that escape from the specimen 8 at a variety of angles with relatively low energy (3 to 50 eV). The secondary and the back scattered electrons reach the detector 16 and are measured. By scanning the electron beam over the specimen and displaying/recording the output of the detector 16 an image of the surface of the specimen 8 is formed. The specimen 8 is supported on a stage 7 (specimen support) which is moveable horizontally in all directions, in order to allow the electron beam 4 to reach the target areas on the specimen which are to be examined.

Due to the deflector 11 that is integrated into the objective lens 10 (FIG. 2, FIG. 3) the electron beam 4 hits the specimen under a predetermined angle of incidence θ, preferably in the range between 1° and 20° degrees. By providing an oblique angle of incidence stereo images of a specimen can be produced in a fast and reliable manner. Such stereo images of a specimen may for example be used in order to perform an accurate height measurements on features that can be found on the surface of the specimen. Once the depth or the height of a feature is known, this information can be used in order to determine further interesting parameters. For example, in the semiconductor industry during the processing of a semiconductor wafer, it is very helpful to know the true width of a contact hole at its bottom. By knowing the depth of a contact hole, stereo images of the contact hole can be used in order to determine this parameter.

Figure 2:
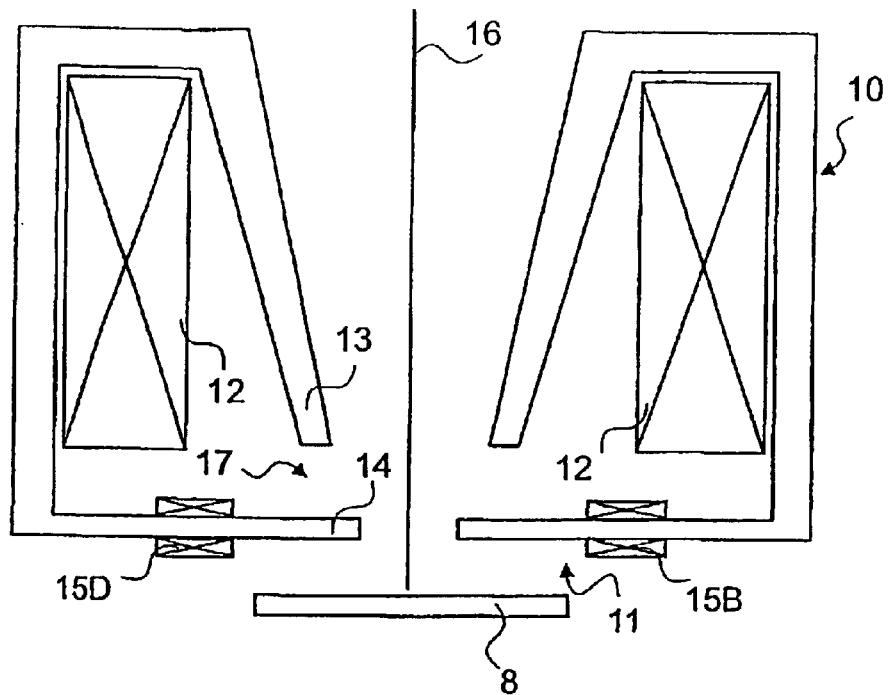
FIG. 2 shows schematically an objective lens according to a embodiment according to the present invention.

FIG. 2 shows schematically an objective lens 10 according to a embodiment according to the present invention. The objective lens 10 includes a first excitation coil 12 which is used to generate a magnetic field which, in turn, is used to focus the electron beam onto the surface of the specimen 8. To achieve a short focal lengths, the magnetic field generated by the first excitation coil 12 is guided through the upper pole piece 13 and the lower pole piece 14 to the pole piece gap 17. Accordingly, the magnetic field is concentrated into a small spatial region around an axis of symmetry 16 of the objective lens 10. The magnetic field is rotational symmetrically around the axis of symmetry 16 and reaches its maximum strength in a pole piece gap 17. The electrons basically move along the axis of symmetry 16 of the objective lens 10, which, accordingly, also represents the path of the electrons.

Figure 3:
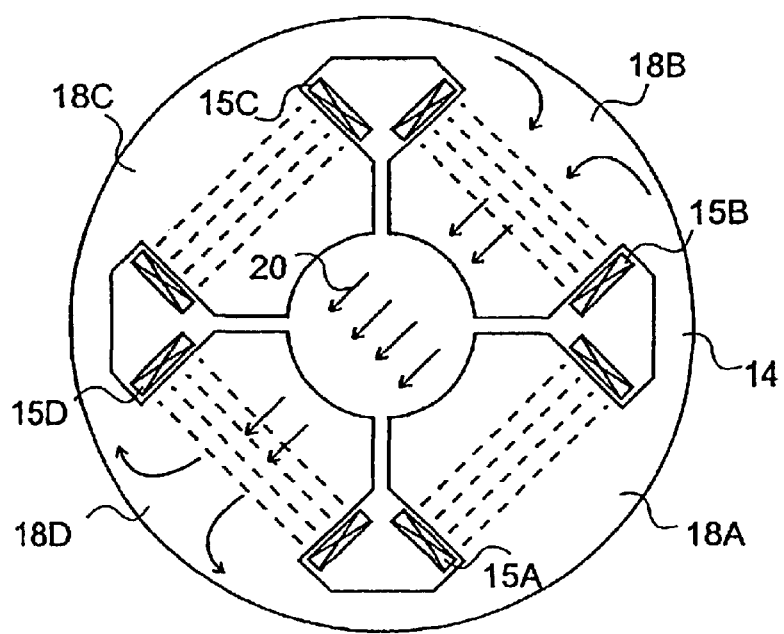
FIG. 3 shows schematically a top view of the lower pole piece of the objective lens shown in FIG. 2.

In order to achieve a predetermined angle of incidence θ on the surface of the specimen the objective lens includes a deflector 11. The deflector 11 comprises four additional (second) excitation coils 15 located on the lower pole piece 14. As can be seen from FIG. 3 the lower pole piece 14 is divided into four segments 18A to 18D thereby forming a four-pole. Thereby, each segment 18A to 18D has its corresponding second excitation coil 15A to 15D. The second excitation coils 15A to 15D are wrapped around the segments 18A to 18D, so that by exciting one the second excitation coils 15A to 15D a magnetic field is generated in the corresponding segment 18A to 18D of the lower pole piece 14. FIG. 3 shows a situation in which the second excitation coils 15B and 15D are excited so that the magnetic field 20 (represented by the arrows in FIG. 3) is generated. As can be seen from FIG. 3 the magnetic field 20 is basically perpendicular to the path of the electron beam. Accordingly, a magnetic field across the path of the electron beam is generated which leads to a deflection of the electron beam.

Due to the segments 18A to 18D of the lower pole piece 14, the magnetic field is guided to an area close above the specimen 8 and generates the required strong deflection field. It should be kept in mind that the segments 18A to 18D of the lower pole piece 14 at the same time also guide the magnetic field generated by the first excitation coil 12. On the symmetry axis 16 the magnetic field generated the excitation coil 12 and magnetic field generated by the second excitation coils 15A to 15D partially overlap. Thereby, the maximum of the deflection field is closer to the specimen 8 than the maximum of the focussing field. In that manner, large angles of incidence θ in the range of 5–20° degrees can be achieved without creating large lateral movements of the beam on the specimen.

Figure 4:
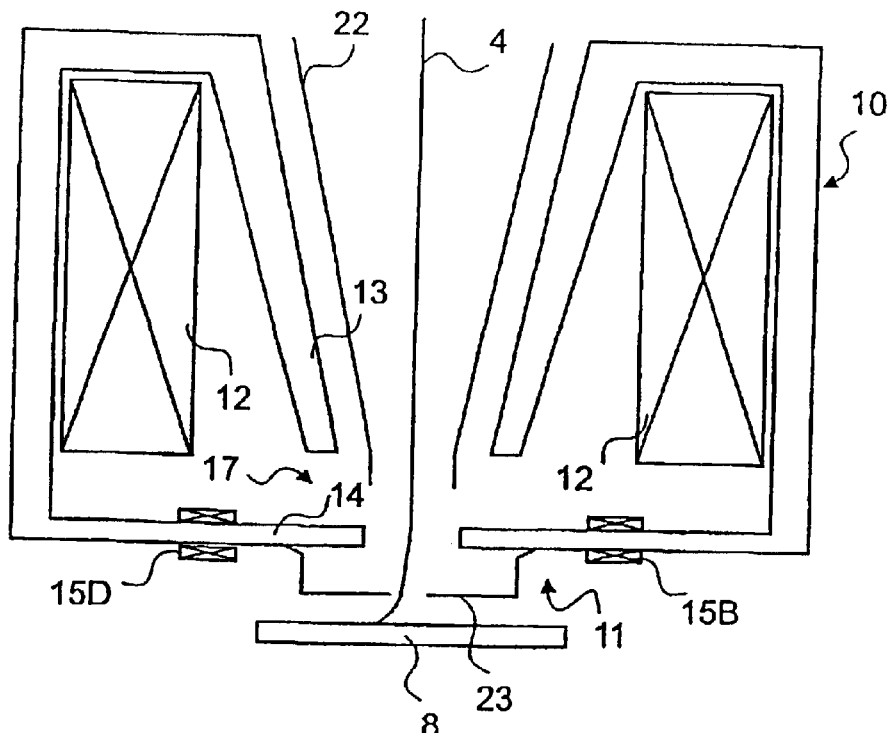
FIG. 4 shows schematically an objective lens according to a further embodiment according to the present invention.

FIG. 4 shows schematically an objective lens according to a further embodiment according to the present invention. In addition to the magnetic lens the objective lens shown in FIG. 3 contains an electrostatic retarding lens which is situated close to magnetic lens. The electrostatic retarding lens has two electrodes 22, 23 held at different potentials. In the illustrated embodiment one of the two electrodes 22 is formed by a cylindrical beam tube which is arranged within the upper pole piece 13 of the magnetic lens along the path of the electron beam 4. The second electrode 23 of the electrostatic retarding lens is a metallic cup provided below the magnetic lens. During the operation of the system the first electrode 22 is usually held at high positive potential, for example 8 kV, where as the second electrode 23 is held at lower positive potential, for example 3 kV, so that the electrons are decelerated in the corresponding electrostatic field from a first energy to lower second energy.

In the example shown in FIG. 4, the specimen 8 is held at ground potential. Accordingly, there is a further electrostatic retarding field between the metallic cup 23 and the specimen 8. Due to the electrostatic retarding field between the metallic cup 23 and the specimen 8, an initial deflection of the electron beam 4 caused by the magnetic field 20 is enhanced leading to an increased angle of incidence θ. Accordingly, in order to achieve a predetermined angle of incidence θ only a relative small deflection caused by the deflector 11 is necessary. However, the surface of the specimen 8 need not be grounded. The electric potential on the surface of the specimen 8 may also be adjusted by applying a voltage to the specimen 8. A voltage can be applied to a wafer, for example, in order to obtain voltage contrast imaging which is used to detect shorts in a circuit. As long as the potential of the metallic cup 23 is higher than the potential on the surface of the specimen 8, an electrostatic retarding field is produced.

Figure 5:
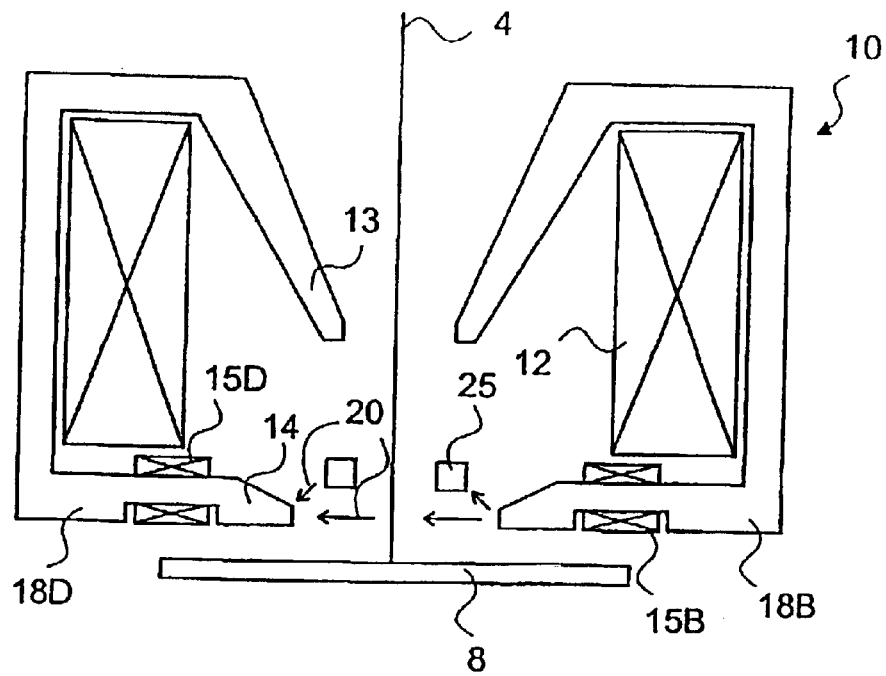
FIG. 5 shows schematically an objective lens according to a further embodiment according to the present invention.

FIG. 5 shows schematically an objective lens according to a further embodiment according to the present invention. The objective lens shown in FIG. 5 exhibits four trenches 24 arranged on the bottom surface of each segment 18A to 18D of the lower pole piece 14. Thereby, each trench 24 is used to house the corresponding second excitation coils 15A to 15D. Accordingly, an increase in the working distance between the objective lens 10 and the specimen 8 due to the second excitation coils 15A to 15D can be avoided. Furthermore, the objective lens shown in FIG. 5 exhibits a field termination structure 25, which is used to terminate the magnetic field of the deflector 11 close above the specimen 8. In the example shown in FIG. 5 the field termination structure 25 is a ring made of magnetic material which is placed in the pole piece gap between the upper pole piece 13 and the lower pole piece 14. There, the field termination structure 25 is used to concentrate the magnetic field of the deflector 11 in the region close to the specimen 8.

Figure 6:
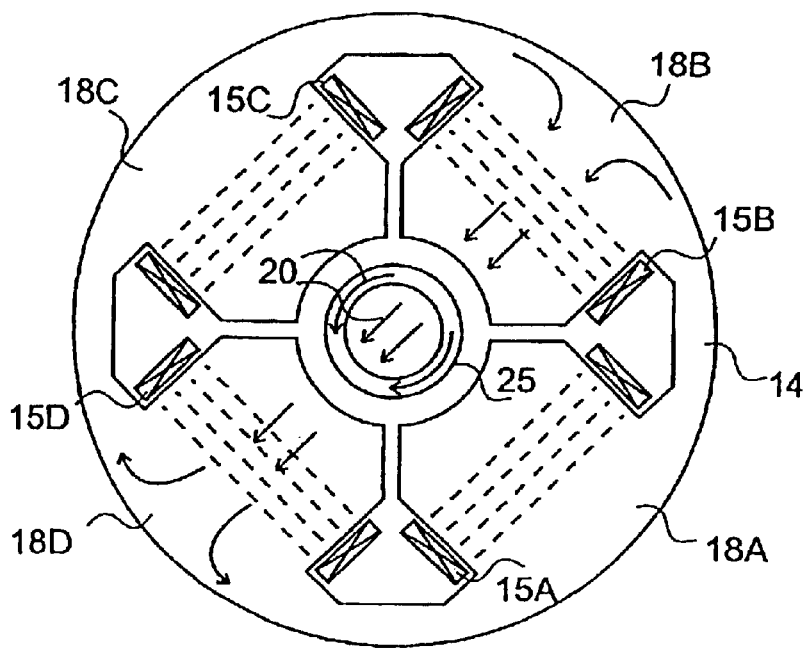
FIG. 6 shows schematically a top view of the field termination structure and the lower pole piece of the objective lens shown in FIG. 5.

As can be seen from FIG. 6 the lower pole piece 14 is divided into four segments 18A to 18D thereby forming a four-pole. Thereby, each segment 18A to 18D has its corresponding second excitation coil 15A to 15D. The second excitation coils 15A to 15D are wrapped around the segments 18A to 18D, so that by exciting one the second excitation coils 15A to 15D a magnetic field is generated in the corresponding segment 18A to 18D of the lower pole piece 14. Again, FIG. 6 shows a situation in which the second excitation coils 15B and 15D are excited so that the magnetic field 20 (represented by the arrows in FIG. 6) is generated. As can be seen from FIG. 6 the magnetic field 20 is basically perpendicular to the path of the electron beam. Accordingly, a magnetic flux across the path of the electron beam is generated which leads to a deflection of the electron beam. Furthermore, that portion of the magnetic deflection field 20 that would extend upward within the objective lens 10 (FIG. 5), enters the field termination structure 25 and is guided therein from a position close to segment 18B to a position close to segment 18D where the magnetic deflection field 20 leaves the field termination structure 25 and enters the lower pole piece 14 again. Thereby, the field termination structure 25 does not significantly influence the focussing field of the objective lens 10, but concentrates the deflection field 20 effectively.

Figure 7:
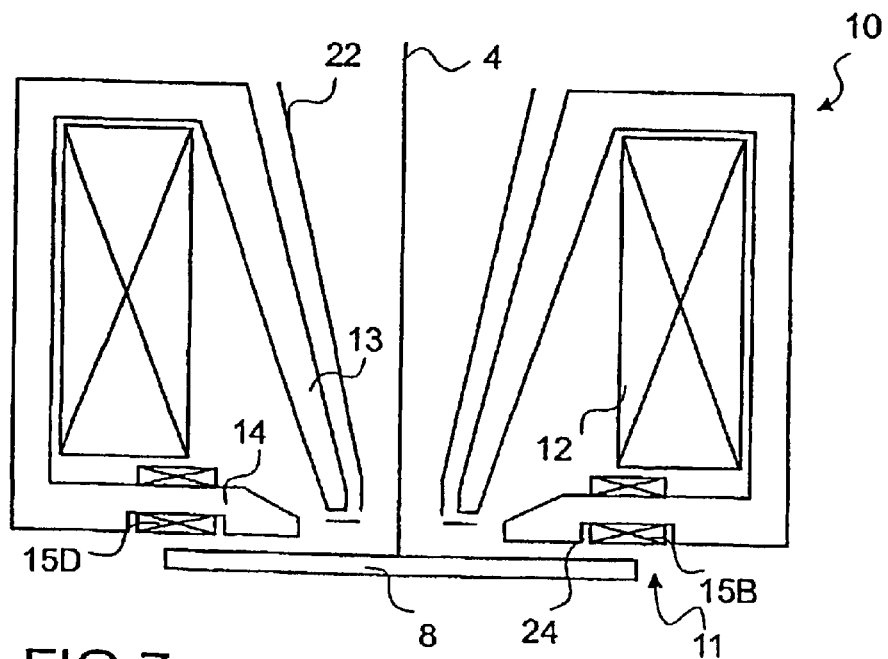
FIG. 7 shows schematically an objective lens according to a further embodiment according to the present invention.

FIG. 7 shows schematically an objective lens according to a further embodiment according to the present invention. Similar to the objective lens shown in FIG. 4 the objective lens shown in FIG. 7 contains, in addition to the magnetic lens, an electrostatic retarding lens. The electrostatic retarding lens has one electrode 22 which is formed by a cylindrical beam tube arranged within the upper pole piece 13 of the magnetic lens along the path of the electron beam 4. The second electrode of the electrostatic retarding lens is the specimen 8 itself. During the operation of the system the electrode 22 is usually held at high positive potential, for example 8 kV, where as the specimen is held at lower positive potential, for example ground potential, so that the electrons are decelerated in the corresponding electrostatic field from a first energy to lower second energy.

Similar to the objective lens shown in FIG. 5 the objective lens shown in FIG. 7 exhibits four trenches 24 arranged on the bottom surface of each segment 18A to 18D of the lower pole piece 14. Again, each trench 24 is used to house the corresponding second excitation coils 15A to 15D. Accordingly, an increase in the working distance between the objective lens 10 and the specimen 8 due to the second excitation coils 15A to 15D can be avoided. Furthermore, the tip of the upper pole piece 13 of the magnetic lens 10 is positioned inside the magnetic field of the deflector 11. Thus, the tip of the upper pole piece 13 functions as a field termination structure for the magnetic field of the deflector 11. This eliminates the expansion of the magnetic field of the deflector 11 higher in the objective lens 10. The upper pole piece 13 leads to a termination of the magnetic field, which helps to concentrate the deflecting field in the area close to the specimen 8.

Figure 8:
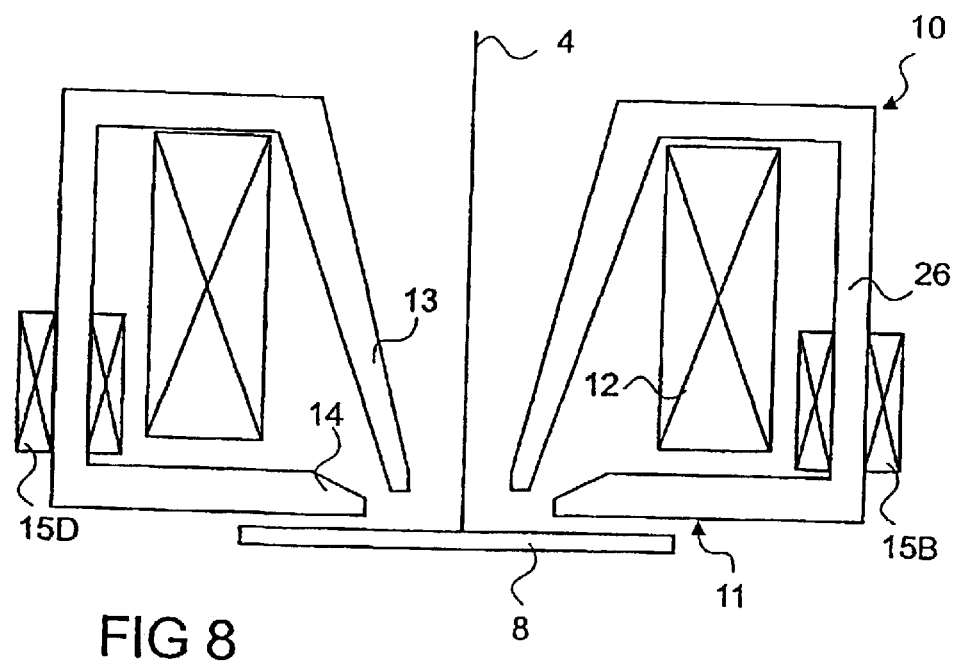
FIG. 8 shows schematically an objective lens according to a further embodiment according to the present invention.

FIG. 8 shows schematically an objective lens according to a still further embodiment according to the present invention. Again, the deflector 11 comprises four additional (second) excitation coils 15A to 15D. However, in contrast to the previous examples, the excitation coils 15A to 15D are not located on the lower pole piece 14 but on the outer pole piece 26 which connects the lower pole piece 14 with the upper pole piece 13. Thereby, the lower pole piece 14 and the outer pole piece 26 are divided into four segments 18A to 18D thereby forming a four-pole. Again, each segment 18A to 18D has its corresponding second excitation coil 15A to 15D. The second excitation coils 15A to 15D are wrapped around the segments 18A to 18D on the outer pole piece, so that by exciting one the second excitation coils 15A to 15D a magnetic field is generated in the corresponding segment 18A to 18D of the outer pole piece and the lower pole piece 14. Accordingly, there is no principle difference to the previous arrangement. However, by arranging the second excitation coils 15A to 15D at the outer pole piece 26, usually more space is available for the second excitation coils 15A to 15D.

In the embodiment shown in FIG. 8 the lower pole piece 14 and the outer pole piece 26 are divided into four segments 18A to 18D. However, any other number of segments might also be used. The lower pole piece 14 and the outer pole piece 26 may, for example, be divided into eight segments 18A to 18D thus forming an eight-pole. It is not necessary that the complete outer pole piece 26 is divided into segments. It is sufficient that only that portion which located below the second excitation coils 15A to 15D is divided into the segments 18A to 18D.

Figure 9:
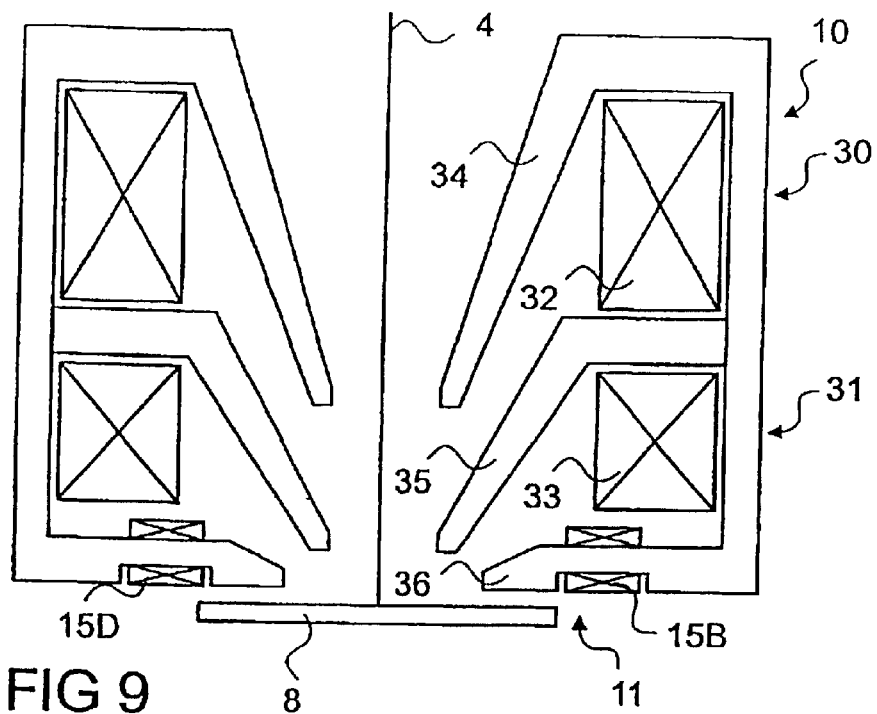
FIG. 9 shows schematically an objective lens according to a further embodiment according to the present invention.

FIG. 9 shows schematically an objective lens according to a still further embodiment according to the present invention. In contrast to the previous examples of the present invention, the embodiment shown in FIG. 9 exhibits two independent magnetic lenses 30 and 31 for focussing the beam 4 of charged particles onto the specimen 8. The upper magnetic lens 30 comprises the first excitation coil arrangement 32 to produce a magnetic field within the pole piece gap between upper pole piece 34 and the middle pole piece 35. Thereby, the middle pole piece 35 serves as a "lower" pole piece for the upper magnetic lens 30. The lower magnetic lens 31 comprises the first excitation coil arrangement 33 to produce a magnetic field within the pole piece gap between middle pole piece 35 and the lower pole piece 36. Thereby, the middle pole piece 35 serves as a "upper" pole piece for the lower magnetic lens 31. By selecting the currents through the two coil arrangements 32 and 33 the magnetic fields in the two pole piece gaps can be adjusted which determines the overall focal length the objective lens 10.

In order to achieve a predetermined angle of incidence θ on the surface of the specimen the objective lens shown in FIG. 9 also includes a deflector 11. The deflector 11 comprises four additional (second) excitation coils 15A to 15D located on the lower pole piece 36. Again the lower pole piece 36 is divided into four segments thereby forming a four-pole. Furthermore, each segment has its corresponding second excitation coil 15A to 15D. The second excitation coils 15A to 15D are wrapped around the segments, so that by exciting one the second excitation coils 15A to 15D a magnetic field is generated in the corresponding segment of the lower pole piece 36. Furthermore, the middle pole piece 35 of the objective lens 10 is positioned inside the field of the deflector 11. Thus part of the magnetic field of the deflector 11 closes through the tip of the middle pole piece 35. Again, this eliminates the expansion of the magnetic field of the deflector 11 higher in the objective lens. Accordingly, the middle pole piece 35 leads to a termination of the magnetic field, which helps to concentrate the deflecting field in the area close to the specimen 8.

The embodiment shown in FIG. 9 does not exhibit an electrostatic lens in addition to the two magnetic lenses 30 and 31. However, an electrostatic lens can be generated by applying a potential difference between the specimen 8 and the objective lens 10. Furthermore, additional electrodes like those shown in FIGS. 4 and 5 can also be provided.

Figure 10:
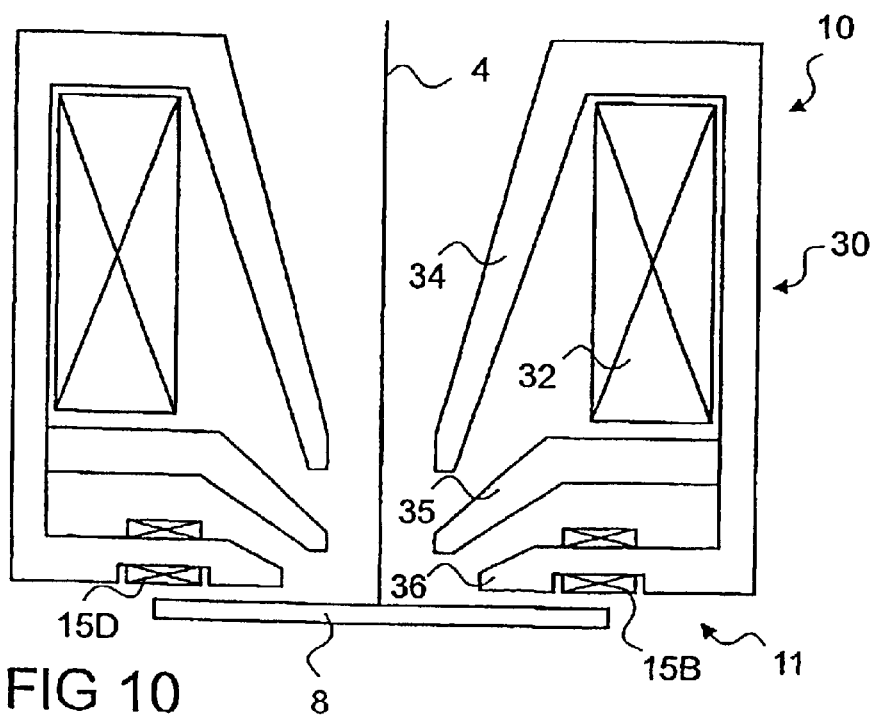
FIG. 10 shows schematically an objective lens according to a further embodiment according to the present invention.

FIG. 10 shows schematically an objective lens according to a still further embodiment according to the present invention. In contrast to the embodiment shown in FIG. 9, the embodiment shown in FIG. 10 exhibits only one first excitation coil arrangement 32 to produce a magnetic field within the pole piece gap between upper pole piece 34 and the middle pole piece 35. In order to further focus the beam 4 of charged particles, the second excitation coils 15A to 15D arranged on the lower pole piece 36 can be used. An identical excitation (symmetric excitation) of the four second excitation coils 15A to 15D creates an axially symmetric field between the middle pole piece 35 and the lower pole piece that can be used to focus the beam 4 of charged particles onto the specimen 8. An asymmetric excitation of the second excitation coils 15A to 15 creates an asymmetric filed which to a deflection of the beam 4 of charged particles. The middle pole piece 35 again terminates the magnetic field produced by the second excitation coils 15A to 15D.

Figure 11:
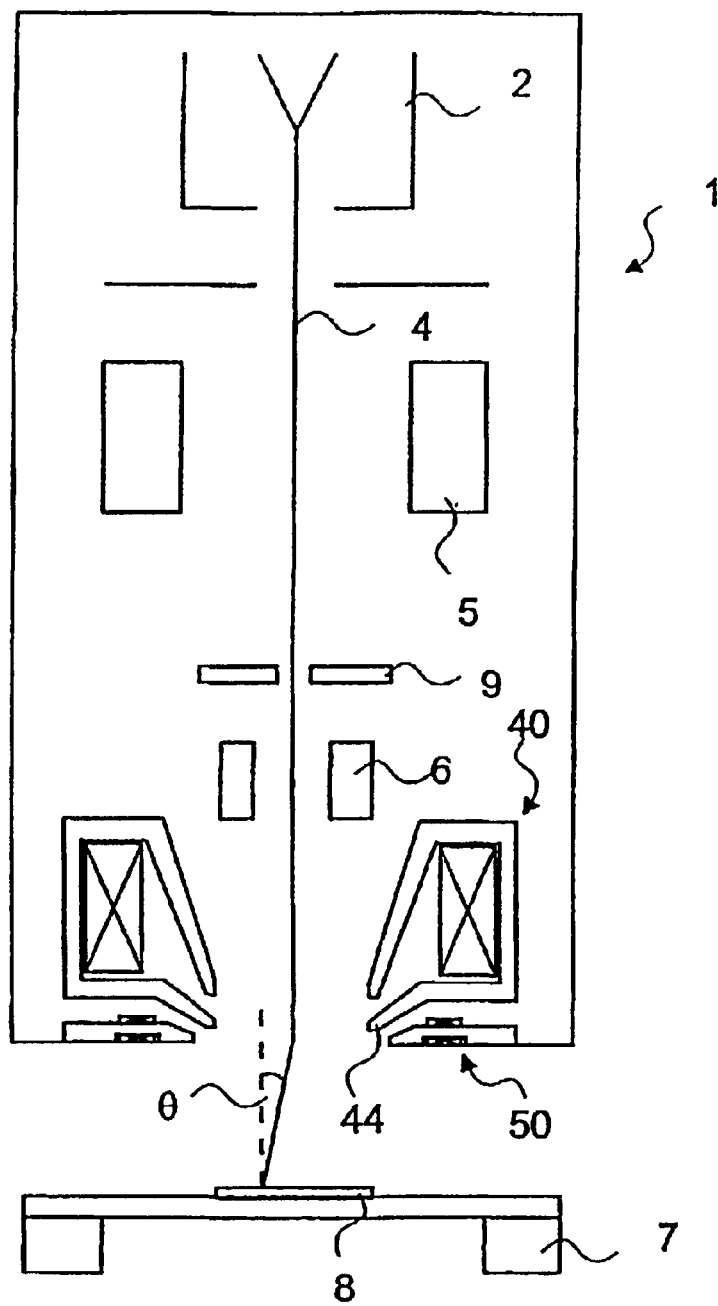
FIG. 11 shows schematically a column according to a further embodiment according to the present invention.

A further embodiment according to the invention is shown schematically in FIG. 11. This embodiment is similar to that of FIG. 1, except for the following. The column 40 shown in FIG. 11 comprises a magnetic objective lens 40 for focusing the charged particle beam 4 onto the specimen 8. Close to the specimen 8 the objective lens 40 has a lower pole piece 44. However, in contrast to the previous example, the objective lens 44 used in this embodiment of the invention does not comprises a deflector integrated into the objective lens, which is used to tilt the beam 4 of charged particles.

Figure 12:
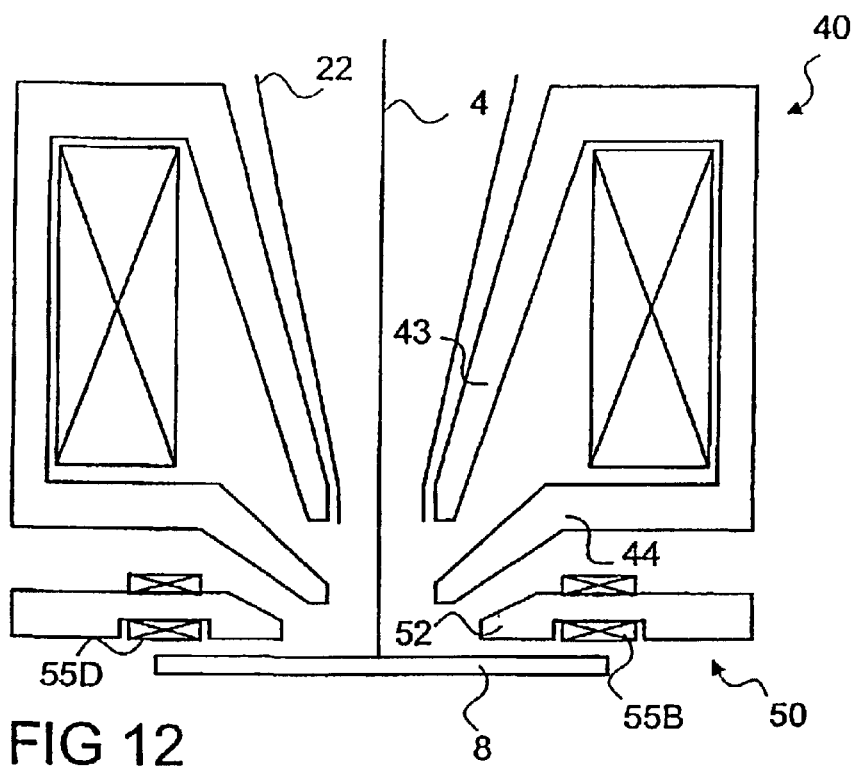
FIG. 12 shows schematically an enlarged view of the objective lens and the deflector shown in FIG. 11.

As can be seen from FIG. 12, the actual deflector 50 is provided as a separate entity, even though it might be fixed to the objective lens. The deflector 50 is arranged below the lower pole piece 44 of the objective lens 40. The deflector 50 is divided into four segments thereby forming a four-pole. Furthermore, each segment has its corresponding excitation coil 55A to 55D. The excitation coils 55A to 55D are wrapped around the segments, so that by exciting one the excitation coils 55A to 55D a magnetic field is generated in the corresponding segment of the deflector. A top view on the deflector 50 is similar to the top views on the lower pole piece 14 of the objective lens 10 as shown in FIG. 3 or FIG. 7.

The magnetic deflector 50 is arranged between the lower pole piece 44 and the specimen 8 whereby the lower pole piece 44 is located within the magnetic filed of the deflector 50 in order to concentrate the magnetic field of the deflector in a region close to the specimen 8. Thus, the lower pole piece 44 of the objective lens 40 functions as a field termination structure for the magnetic filed of the deflector 50. Due to this field termination effect of the lower pole piece 44 of the objective lens 40, the magnetic field of the deflector 50 does not negatively interfere with the focussing field provided in the pole piece gap between the upper pole piece 43 and the lower pole piece 44. Due to the fact that the magnetic deflector 50 is arranged very close to the specimen 8, a large angle of incidence can be provided on the surface of the specimen without producing large lateral movements of the charged particle beam on the specimen.

Similar to the objective lens shown in FIG. 5 the objective lens shown in FIG. 12 contains, in addition to the magnetic lens, an electrostatic retarding lens. The electrostatic retarding lens has one electrodes 22 which is formed by a cylindrical beam tube arranged within the upper pole piece 43 of the magnetic lens along the path of the electron beam 4. The second electrode of the electrostatic retarding lens is the specimen 8 itself. During the operation of the system the electrode 22 is usually held at high positive potential, for example 8 kV, where as the specimen 8 is held at lower positive potential, for example ground potential, so that the electrons are decelerated in the corresponding electrostatic field from a first energy to lower second energy. In the region between the lower pole piece 44 and the specimen 8, the electrostatic retarding field and the magnetic deflection overlap. Due to the electrostatic retarding field between the electrode 22 and the specimen 8, an initial deflection of the electron beam 4 caused by the magnetic deflection field is enhanced leading to an increased angle of incidence. Accordingly, in order to achieve a predetermined angle of incidence only a relative small deflections caused by the deflector 50 are necessary.

Figure 13:
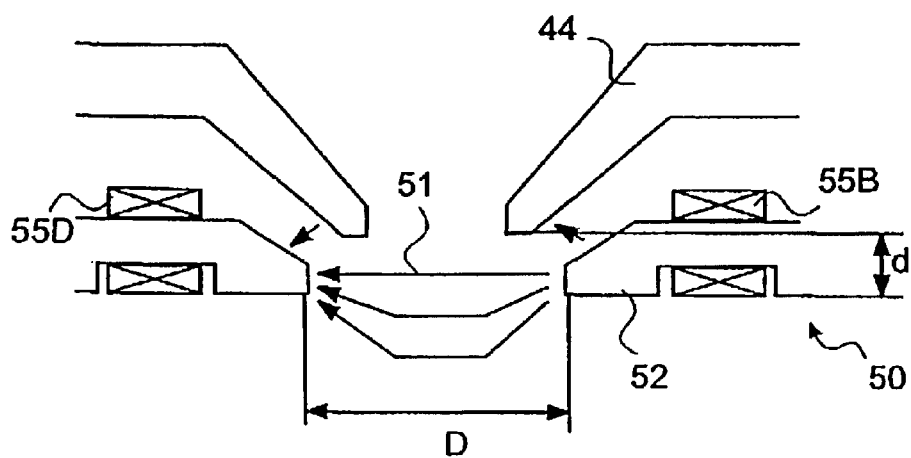
FIG. 13 shows schematically an enlarged view of the deflector shown in FIG. 12.

FIG. 13 shows schematically an enlarged view of the deflector shown in FIG. 12. As can be seen from FIG. 13, part of the magnetic flux of the deflector 50 closes through the tip of the lower pole piece 44 of the objective lens 40 so that the extension of the deflection field 51 far from the specimen is eliminated. The deflection field 51 thus is effective mainly in the area of the retarding electrostatic lens between the lower pole piece 44 and the specimen 8. Thereby, the inner diameter "D" of the deflector pole piece 52 is significantly bigger than the distance "d" of its lower face from the lower face of the lower pole piece 44 of the objective lens 40. The ratio Diameter/distance is preferably bigger than 2, more preferably bigger than 4. Furthermore, the deflector pole piece 52 can be electrically insulated from the lower pole piece 44. This allows to select the electric potential on the deflector pole piece 52 arbitrarily, which can be used in order to produce a predetermined potential distribution adapted to specific measurement conditions.

Figure 14:
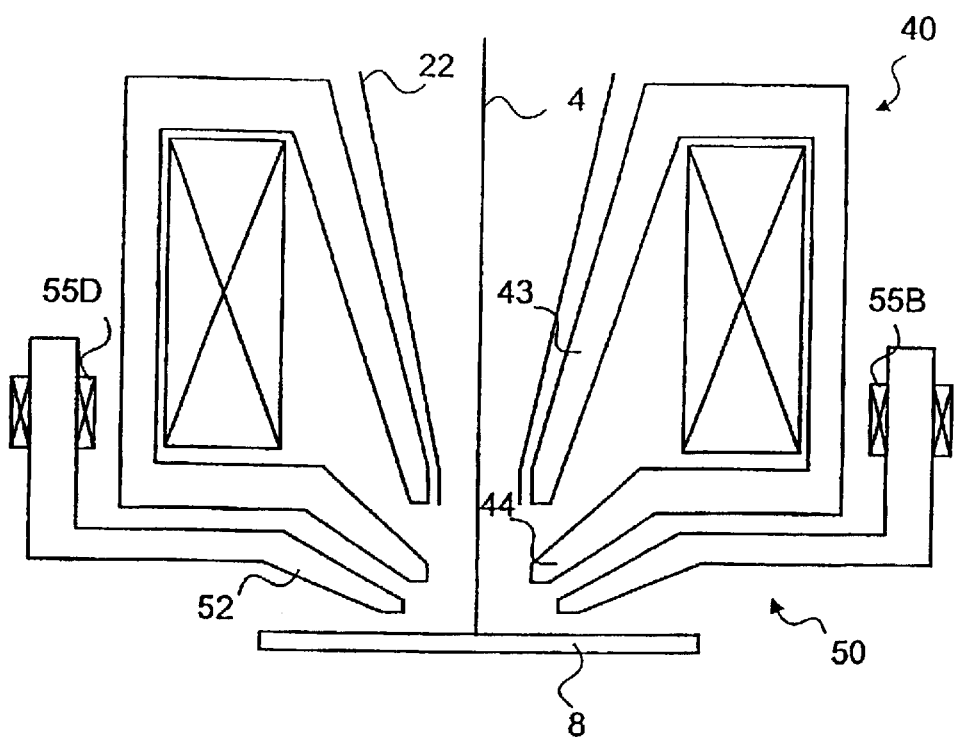
FIG. 14 shows schematically a deflector for a column as shown in FIG. 11.

FIG. 14 shows schematically an deflector arrangement 50 according to a still further embodiment according to the present invention. In contrast to the examples of the present invention shown in FIGS. 11 to 13, the deflector shown in FIG. 14 exhibits four excitation coils 55A to 55D that are not located close to the specimen 8 but parallel to the excitation coil 12 of the objective lens 40. Accordingly, more space is available for the four excitation coils 55A to 55D. Furthermore, the deflector pole piece 52 is not parallel to specimen 8, as in the previous example, but parallel to lower pole piece 44 of the objective lens 40. However, these differences do not affect the principle operation of the deflector 50.

What is claimed is:

1. An objective lens for a charged particle beam device, which is used to examine or to modify a specimen, said objective lens comprising:

a) at least two pole pieces whereby a lower pole piece is spaced from an upper pole piece by a pole piece gap, said upper and lower pole pieces providing a path for the charged particle beam b) at least one first excitation coil arrangement for generating a first magnetic field between said upper pole piece and said lower pole piece to focus the charged particle beam onto the specimen, and c) a magnetic deflector having at least one second excitation coil arrangement for generating a second magnetic field to deflect the charged particle beam, said second magnetic field being guided through at least one of the pole pieces.

2. The objective lens according to claim 1, wherein the lower pole piece is divided into at least two segments each being provided with an independent second excitation coil arrangement, so that the second magnetic field used to deflect the charged particle beam is guided through the lower pole piece.

3. The objective lens according to claim 2, wherein the lower pole piece is divided into four segments.

4. The objective lens according to claim 2, wherein the lower pole piece is divided into eight segments.

5. The objective lens according to claim 1, wherein said objective lens further comprises an electrostatic lens.

6. The objective lens according to claim 5, wherein a first electrode is arranged in a region of said upper pole piece and means for applying a first potential to said first electrode are provided and wherein a second electrode and means for applying a second potential to said second electrode are pro-vided to generate an electrical field in said electrostatic lens so that a particle beam in said electrical field is decelerated from a first energy to a second lower energy.

7. The objective lens according to claim 6, wherein said first electrode is a hollow cylindrical electrode disposed within said upper pole piece.

8. The objective lens according to claim 6, wherein the second electrode is a metallic cup provided below the lower pole piece.

9. The objective lens according to claim 6, wherein the second electrode is the specimen.

10. The objective lens according to claim 2, wherein each segment of the lower pole piece is provided with a trench arranged at the surface of the segment directing toward the specimen to house the second excitation coil arrangement.

11. The objective lens according to claim 1, wherein a pole piece is positioned inside the second magnetic field to concentrate the second magnetic field in a region close to the specimen.

12. The objective lens according to claim 1, wherein a field termination structure is positioned inside the second magnetic field to concentrate the second magnetic field in a region close to the specimen.

13. The objective lens according to claim 1, wherein the lower pole piece and the outer pole piece is divided into at least two segments and each segment is provided with an independent second excitation coil arrangement located on the outer pole piece.

14. The objective lens according to claim 1, wherein the inner diameter of the deflector is larger than the distance between the surface of the magnetic deflector, which directs to the specimen, and the lower pole piece.

15. The objective lens according to claim 14, wherein the inner diameter of the deflector is two times, preferably four times, larger than the distance between the surface of the magnetic deflector, which directs to the specimen, and the lower pole piece.

16. A column for a charged particle beam device, which is used to examine or to modify a specimen, said column comprising:

a) a particle source for providing a beam of charged particles;

b) a detector for measuring at least one secondary product and/or back-scattered particles coming from the specimen; and c) an objective lens according to one of the preceding claims for focusing the charged particle beam onto the specimen.

17. A column for a charged particle beam device, which is used to examine or to modify a specimen, said column comprising:

a) a particle source for providing a beam of charged particles;

b) a detector for measuring at least one secondary product and/or backscattered particles coming from the specimen;

c) an objective lens for focusing the charged particle beam onto the specimen; and d) a magnetic deflector having at least one excitation coil arrangement for generating a magnetic field to deflect the charged particle beam and at least one deflector pole piece extending substantially perpendicular to the optical axis of the column, said magnetic deflector being arranged between the objective lens and specimen, wherein a surface of said deflector pole piece faces a surface of a lower pole piece of said objective lens and extends substantially parallel to said surface so that at least part of the magnetic flax of the deflector closes through the lower pole piece of said objective lens, and whereby the objective lens concentrates the magnetic field of the deflector in a region close to the specimen.

18. The column according to claim 17, wherein said objective lens is a magnetic objective lens having a lower pole piece close to the specimen and the lower pole piece concentrates the magnetic field of the deflector in a region close to the specimen.

19. The column according to claim 17, wherein the magnetic deflector is four pole.

20. The column according to claim 17, wherein the magnetic deflector is eight-pole.

21. The column according to claim 17, wherein the inner diameter of the deflector is larger than the distance between the surface of the magnetic deflector, which directs to the specimen, and the lower pole piece.

22. The column according to claim 21, wherein the inner diameter of the deflector is two times, preferably four times, larger than the distance between the surface of the magnetic deflector, which directs to the specimen, and the lower pole piece.

23. The column according to claim 17, wherein the deflector is provided with trenches arranged at the surface of the deflector directing towards the specimen to house excitation coil arrangements used to produce the deflection field.

24. The column according to claim 17, wherein said objective lens further comprises an electrostatic lens.

25. The column according to claim 24, wherein a first electrode and means for applying a first potential to said first electrode are provided and wherein a second electrode and means for applying a second potential to said second electrode are provided to generate an electrical field in said electrostatic lens so that a particle beam in said electrical field is decelerated from a first energy to a second lower energy.

26. The column according to claim 25, wherein the second electrode is the specimen.

* * * * *